United States Patent
Mizuta et al.

(10) Patent No.: US 8,828,918 B2
(45) Date of Patent: Sep. 9, 2014

(54) SEMICONDUCTOR SURFACE TREATING AGENT COMPOSITION AND METHOD FOR TREATING SEMICONDUCTOR SURFACE USING THE SEMICONDUCTOR SURFACE TREATING AGENT COMPOSITION

(75) Inventors: Hironori Mizuta, Saitama (JP); Osamu Matsuda, Saitama (JP)

(73) Assignee: Wako Pure Chemical Industries, Ltd., Osaka-shi (JP)

( * ) Notice: Subject to any disclaimer, the term of this patent is extended or adjusted under 35 U.S.C. 154(b) by 324 days.

(21) Appl. No.: 12/921,302

(22) PCT Filed: Mar. 6, 2009

(86) PCT No.: PCT/JP2009/054248
§ 371 (c)(1),
(2), (4) Date: Sep. 7, 2010

(87) PCT Pub. No.: WO2009/110582
PCT Pub. Date: Sep. 11, 2009

(65) Prior Publication Data
US 2011/0021400 A1 Jan. 27, 2011

(30) Foreign Application Priority Data
Mar. 7, 2008 (JP) .................. 2008-058816

(51) Int. Cl.
*G03F 7/42* (2006.01)
*H01L 21/311* (2006.01)
*C11D 11/00* (2006.01)

(52) U.S. Cl.
CPC .......... *H01L 21/31133* (2013.01); *G03F 7/426* (2013.01); *C11D 11/0047* (2013.01); *G03F 7/425* (2013.01)
USPC ............................. 510/175; 510/176; 134/1.3

(58) Field of Classification Search
CPC .................... H01L 21/31133; C11D 11/0047; G03F 7/425; G03F 7/426
USPC .................................... 510/175, 176; 134/1.3
See application file for complete search history.

(56) References Cited

U.S. PATENT DOCUMENTS

| | | | |
|---|---|---|---|
| 5,814,563 A | 9/1998 | Ding et al. | |
| 5,843,847 A | 12/1998 | Pu et al. | |
| 6,777,380 B2 * | 8/2004 | Small et al. | 510/176 |
| 6,824,833 B2 * | 11/2004 | Nishikawa et al. | 427/387 |
| 7,235,188 B2 * | 6/2007 | Daviot et al. | 252/79.1 |
| 7,273,060 B2 * | 9/2007 | Patel et al. | 134/1.3 |
| 7,456,140 B2 * | 11/2008 | Small et al. | 510/175 |
| 7,498,294 B2 * | 3/2009 | Konno et al. | 510/175 |
| 7,723,238 B2 | 5/2010 | Chiba | |
| 7,947,130 B2 * | 5/2011 | Lee | 134/3 |
| 7,947,637 B2 * | 5/2011 | Kneer | 510/175 |
| 2002/0037820 A1 * | 3/2002 | Small et al. | 510/175 |
| 2003/0083214 A1 | 5/2003 | Kakizawa et al. | |
| 2003/0171239 A1 * | 9/2003 | Patel et al. | 510/406 |
| 2004/0038840 A1 * | 2/2004 | Lee et al. | 510/202 |
| 2004/0137736 A1 * | 7/2004 | Daviot et al. | 438/690 |
| 2005/0187118 A1 | 8/2005 | Haraguchi et al. | |
| 2005/0202987 A1 * | 9/2005 | Small et al. | 510/175 |
| 2005/0282394 A1 | 12/2005 | Chiba | |
| 2005/0287480 A1 * | 12/2005 | Takashima | 430/331 |
| 2006/0110690 A1 | 5/2006 | Haraguchi et al. | |
| 2006/0138399 A1 | 6/2006 | Itano et al. | |
| 2007/0054135 A1 | 3/2007 | Morita et al. | |
| 2007/0078073 A1 * | 4/2007 | Auger | 510/175 |
| 2007/0135321 A1 * | 6/2007 | Patel et al. | 510/175 |
| 2007/0235061 A1 * | 10/2007 | Mizuta et al. | 134/2 |
| 2008/0004197 A1 * | 1/2008 | Kneer | 510/245 |
| 2008/0242574 A1 * | 10/2008 | Rath et al. | 510/176 |
| 2008/0242575 A1 | 10/2008 | Haraguchi et al. | |
| 2009/0107520 A1 * | 4/2009 | Lee et al. | 134/2 |
| 2009/0130849 A1 * | 5/2009 | Lee | 438/693 |
| 2009/0133716 A1 * | 5/2009 | Lee | 134/3 |
| 2009/0137191 A1 * | 5/2009 | Lee | 451/36 |

(Continued)

FOREIGN PATENT DOCUMENTS

| | | |
|---|---|---|
| CN | 1683487 A | 10/2005 |
| CN | 1872976 A | 12/2006 |
| EP | 1635224 A2 | 3/2006 |
| JP | 10-041274 A | 2/1998 |
| JP | 2004-241414 A | 8/2004 |
| JP | 2006-032908 A | 2/2006 |

(Continued)

OTHER PUBLICATIONS

International Search Report of PCT/JP2009/054248, mailing date May 19, 2009.
Chinese Office Action dated Sep. 28, 2011, issued in corresponding Chinese Patent Application No. 200980108005.3.
Supplementary European Search Report dated Oct. 6, 2011, issued in corresponding European Patent Application No. 09716388.

(Continued)

*Primary Examiner* — Gregory Webb
(74) *Attorney, Agent, or Firm* — Westerman, Hattori, Daniels & Adrian, LLP

(57) ABSTRACT

An object of the present invention is to provide a semiconductor surface treating agent composition, which can realize easy removing of an anti-reflection coating layer in a production process of a semiconductor device or the like at a low temperature in a short time, a method for treating a semiconductor surface using the same, and further a semiconductor surface treating agent composition, which can realize not only removing of both layer of an anti-reflection coating layer and a resist layer, but can realize even removing of a cured resist layer produced in an etching process, and a method for treating a semiconductor surface using the same. The semiconductor surface treating agent composition of the present invention is characterized by comprising a compound which generates a fluorine ion in water, a carbon radical generating agent, and water and optionally an organic solvent, and the method for treating a semiconductor surface of the present invention is characterized by using the composition.

28 Claims, No Drawings

(56) References Cited

U.S. PATENT DOCUMENTS

| | | | |
|---|---|---|---|
| 2009/0137439 A1* | 5/2009 | Dinh et al. ................... | 510/170 |
| 2009/0176677 A1 | 7/2009 | Haraguchi et al. | |
| 2009/0270300 A1* | 10/2009 | Uehara et al. ................ | 510/175 |
| 2010/0043823 A1* | 2/2010 | Lee .............................. | 134/1.3 |
| 2010/0056411 A1 | 3/2010 | Haraguchi et al. | |
| 2011/0021400 A1* | 1/2011 | Mizuta et al. ................ | 510/176 |

FOREIGN PATENT DOCUMENTS

| | | |
|---|---|---|
| JP | 2006-106616 A | 4/2006 |
| JP | 2007-284652 A | 11/2007 |
| WO | 2004/019134 A1 | 3/2004 |
| WO | 2005/057281 A2 | 6/2005 |
| WO | 2006/138505 A1 | 12/2006 |

* cited by examiner

SEMICONDUCTOR SURFACE TREATING AGENT COMPOSITION AND METHOD FOR TREATING SEMICONDUCTOR SURFACE USING THE SEMICONDUCTOR SURFACE TREATING AGENT COMPOSITION

TECHNICAL FIELD

The present invention relates to a semiconductor surface treating agent composition and a method for treating semiconductor surface using the composition. In more detail, the present invention relates to a semiconductor surface treating agent composition, which can realize removing of an anti-reflection coating layer in a production process of a semiconductor device or the like, and further can realize removing of not only an anti-reflection coating layer but also a resist layer locating thereon and a cured resist layer generated in an etching process, and a method for treating a semiconductor surface characterized by using the same.

BACKGROUND OF THE INVENTION

Heretofore, semiconductor devices such as, for example, IC, LSI, have been produced by forming a conductive metal film, an insulation layer and a low dielectric material layer on a substrate such as silicon wafer by an evaporation method or the like; coating thereon an anti-reflection coating layer which inhibits irregular light reflection at exposure and a resist layer; and then forming a resist pattern by selectively exposing and developing these layers; after that selectively etching the conductive metal film, the insulation layer, the low dielectric material and the anti-reflection coating layer using this resist pattern as a mask to form fine circuits; and furthermore removing the resist layer and the anti-reflection coating layer by ashing of the resist layer and the like by ashing or the like; and after that treating resist layer residue and anti-reflection coating layer residue remained in the ashing process and the like with a cleaning (removing) liquid or the like.

On the other hand, although various resist removing agents have been known (e.g. Patent Literature 1 and 2, etc.), there is a problem as follow. Although these removing agents are effective to a substrate on which no anti-reflection coating layer has been originally coated when these resist removing agents are used for treating the substrate after being etched as mentioned above, it is possible to remove a resist layer but difficult to remove the anti-reflection coating layer for a substrate on which an anti-reflection coating layer has been coated. Thus, in the present situation, removing of both layers of a resist layer and an anti-reflection coating layer at the same time depends mostly on techniques such as ashing. However, these techniques such as ashing require large facilities, and also require the cleaning (removing) of residues of ashed resist layer, residues of anti-reflection coating layer, and the like after the ashing process in the present situation when ultrafine circuits are required, and makes the process complicated one.

Under such situation, a method for removing an anti-reflection coating layer by such a convenient means not requiring large facilities as mentioned above has been demanded, and also existence of chemical solution to satisfy this demand or existence of chemical solution, which can realize removing of not only an anti-reflection coating layer but also even a resist layer, has been demanded.

Patent Literature 1: JP-A-2004-241414
Patent Literature 2: JP-A-2006-106616

DISCLOSURE OF INVENTION

Problem to be Solved by the Invention

The problem to be solved by the present invention is to provide a semiconductor surface treating agent composition, which can realize easy removing of an anti-reflection coating layer in a production process of a semiconductor device or the like at a low temperature in a short time, and can also realize removing of both layers of an anti-reflection coating layer and a resist layer coated thereon, and further even removing of a cured resist layer produced in an etching process, and a method for treating semiconductor surface characterized by using the composition.

Means to Solving the Problem

One aspect of the present invention is a semiconductor surface treating agent composition, characterized by comprising a compound generating a fluoride ion in water, a carbon radical generating agent and water.

In addition, another aspect of the present invention is a method for treating semiconductor surface, characterized by using a semiconductor surface treating agent composition comprising a compound generating a fluoride ion in water, a carbon radical generating agent and water.

Effect Of The Invention

The semiconductor surface treating agent composition of the present invention can realize easy removing of an anti-reflection coating layer in a production process of a semiconductor device or the like in a short time. The composition can remove an anti-reflection coating layer effectively by using a compound generating a fluoride ion in water and a carbon radical generating agent in combination, and can also realize removing of an anti-reflection coating layer without causing any adverse effect, for example, on a copper wiring on the semiconductor substrate surface and an insulation film such as Low-k film locating at the lower layer of the anti-reflection coating layer by using a carbon radical generating agent as a radical source.

In addition, the method for treating semiconductor surface of the present invention is an effective method for removing an anti-reflection coating layer easily and in a short time. The method can also realize easy removing of an anti-reflection coating layer without causing any adverse effect, for example, on a copper wiring on the semiconductor substrate surface and an insulation film such as Low-k film or the like locating at the lower layer of the anti-reflection coating layer as mentioned above by using a carbon radical generating agent as a radical source.

DETAILED DESCRIPTION OF THE INVENTION

The compound generating a fluoride ion in water in the semiconductor surface treating agent composition of the present invention specifically includes salts of hydrofluoric acid and an inorganic non-metal base such as, for example, ammonium fluoride, fluoride salts of hydroxylamine; for example, salts of hydrofluoric acid and an organic base such as primary to tertiary alkylamine, primary to tertiary alkanolamine, alicyclic amine, heterocyclic amine; fluoride salts of quaternary ammonium; hydrofluoric acid; and the like. In this connection, primary to tertiary alkylamine includes, for example, alkylamine having 1 to 4 carbon atoms such as, for example, methyl amine, ethyl amine, propyl amine, butyl amine, dimethyl amine, diethyl amine, dipropyl amine, dibutyl amine, trimethyl amine, triethyl amine, tripropyl amine, tributyl amine, and a compound generating a fluoride ion in water, which is a salt of hydrofluoric acid and these alkylamines, includes, for example, monomethylammonium fluoride, monoethylammonium fluoride, monopropylammonium fluoride, monobutylammonium fluoride, dimethylammonium fluoride, diethylammonium fluoride, dipropylammonium fluoride, dibutylammonium fluoride, trimethylammonium fluoride, triethylammonium fluoride, tripropylammonium fluoride, tributylammonium fluoride, and the like. In addition, primary to tertiary alkanolamine includes, for example, monoethanolamine, diethanolamine, triethanolamine, and the like, and a compound generating a fluoride ion in water which is a salt of hydrofluoric acid and these alkanolamines includes, for example, monoethanolammonium fluoride, diethanolammonium fluoride, triethanolammonium fluoride, and the like. Further, alicyclic amine includes, for example, cyclohexylamine, dicyclohexylamine, tricyclohexylamine, and the like, and a compound generating a fluoride ion in water which is a salt of hydrofluoric acid and these alicyclic amines includes, for example, monocyclohexylammonium fluoride, dicyclohexylammonium fluoride, tricyclohexylammonium fluoride, and the like. In addition, heterocyclic amine includes, for example, pyrrolidine, piperidine, morpholine, pyrrole, pyridine, and the like, and a compound generating a fluoride ion in water which is a salt of hydrofluoric acid and these heterocyclic amines includes, for example, pyrrolidinium fluoride, piperidinium fluoride, morpholinium fluoride, pyrrolinium fluoride, pyridinium fluoride, and the like. Still further, a fluoride salt of quaternary ammonium includes tetramethylammonium fluoride, tetraethylammonium fluoride, tetrapropylammonium fluoride, tetrabutylammonium fluoride, and the like.

Among these compounds generating a fluoride ion in water, salts of hydrofluoric acid and an inorganic non-metal base and hydrofluoric acid are preferable from the viewpoints of industrial availability, economical efficiency, solubility to water, and the like, and among them, salts of hydrofluoric acid and an inorganic non-metal base are more preferable, and further among them, ammonium fluoride is further more preferable from the viewpoints of easy handling, efficient removing of an anti-reflection coating layer in a short time, and the like. It should be noted that, when a semiconductor substrate provided with a metal wiring such as multilayer copper wiring structure, which can be adversely affected by alkali metals, is treated, an alkali metal, if present in the composition of the present invention, has a risk to cause deterioration of electrical characteristics on the semiconductor substrate. Therefore, use of a salt containing an alkali metal such as lithium fluoride, potassium fluoride, sodium fluoride, that is, a salt of hydrofluoric acid and an inorganic metal base is not preferable. In addition, as for the compound generating a fluoride ion in water, one kind of compound may be used alone or plural kinds of compounds may be used in combination accordingly.

By using the compound generating a fluoride ion in water mentioned above and a carbon radical generating agent as mentioned below in combination, removing of the anti-reflection coating layer can be realized.

The carbon radical generating agent of the present invention includes a compound which generates carbon radical by heating or light irradiation. Specifically, the agent includes a compound which suitably generates carbon radical by heating, such as, for example, azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine) dihydrochloride, 2,2'-azobis[N-(2-carboxyethyl)-2-methylpropionamidine] tetrahydrate; cyclic azoamidine type carbon radical generating agent such as, for example, 2,2'-azobis[2-(2-imidazoline-2-yl)propane] dihydrochloride, 2,2'-azobis[2-(2-imidazoline-2-yl)propane] disulfate, 2,2'-azobis[2-(2-imidazoline-2-yl)propane] dihydrate, 2,2'-azobis{2-[1-(2-hydroxyethyl)-2-imidazoline-2-yl]propane} dihydrochloride, 2,2'-azobis[2-(2-imidazoline-2-yl)propane], 2,2'-azobis(1-imino-1-pyrrolidino-2-methylpropane) dihydrochloride; azoester type carbon radical generating agent such as, for example, dimethyl-2,2'-azobis(2-methylpropionate); azonitrile carboxylic acid type carbon radical generating agent such as, for example, 4,4'-azobis(4-cyanovaleric acid); azoalkyl type carbon radical generating agent such as, for example, 2,2'-azobis(2,4,4-trimethylpentane); macroazo type carbon radical generating agent such as, for example, dimethylpolysiloxane compound having azo group in a molecule: and a compound which suitably generates carbon radical by light irradiation, such as, for example, benzoin alkyl ether type carbon radical generating agent such as, for example, benzoin methyl ether, benzoin ethyl ether benzoin isopropyl ether, benzoin isobutyl ether; benzylketal type carbon radical generating agent such as, for example, 2,2-dimethoxy-1,2-diphenylethan-1-on; benzophenone type carbon radical generating agent such as, for example, benzophenone, 4,4'-bisdiethylaminobenzophenone, acrylated benzophenone, methyl benzoylbenzoate, 2-benzoylnaphthalene, 4-benzoylbiphenyl, 4-benzoyldiphenylether, 1,4-dibenzoylbenzene, [4-(methylphenylthio)phenyl]phenylmethane; aminobenzoate ester type carbon radical generating agent such as, for example, ethyl p-dimethylaminobenzoate ester, isoamyl ethyl p-dimethylaminobenzoate ester; 1,2-hydroxyalkylphenone type carbon radical generating agent such as, for example, 2-hydroxy-2-methyl-1-phenylpropan-1-on, 1-[4-(2-hydroxyethoxy)phenyl]-2-hydroxy-2-methyl-1-propan-1-on, 2-hydroxy-1-{4-[4-(2-hydroxy-2-methylpropionyl)benzyl]phenyl}-2-methyl propan-1-on, 1-hydroxycyclohexylphenylketone; 1,2-aminoalkylphenone type carbon radical generating agent such as, for example, 2-methyl-1-(4-methylthiophenyl)-2-morpholinopropan-1-on, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone; acylphosphin oxide type carbon radical generating agent such as, for example, 2,4,6-trimethylbenzoylphenylethoxyphosphin oxide, 2,4,6-trimethylbenzoyldiphenylphosphin oxide, bis(2,4,6-trimethylbenzoyl)phenylphosphin oxide; anthraquinone type carbon radical generating agent such as, for example, ethylanthraquinone; thioxanthone type carbon radical generating agent such as, for example, chlorothioxanthone, diethylthioxanthone, isopropylthioxanthone; acridone type carbon radical generating agent such as, for example, 10-butylchloroacridone; imidazole type carbon radical generating agent such as, for example, 2,2'-bis(o-chlorophenyl)-4,5,4',5'-tetraphenyl-1,2'-biimidazole, 2,2'-bis(o-chlorophenyl)-4,5,4',5'-tetrakis(3,4,5-trimethoxyphenyl)-1,2'-biimidazole; oxime ester type carbon radical generating agent such as, for example, 1,2-octandion-1-[4-(phenylthio)-2-(o-benzoyloxime)], ethanon-1-[9-ethyl-6-(2-methylbenzoyl)-9H-carbazol-3-yl]-1-(o-acetyloxime); titanocene type carbon radical generating agent such as, for example, bis(η5-2,4-cyclopentadien-1-yl)-bis(2,6-difluoro-3-(1H-pyrrol-1-yl)phenyl)titanium.

Among these carbon radical generating agents, preferable one is a compound which suitably generates carbon radical by heating, such as, for example, azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine) dihydrochloride, 2,2'-azobis[N-(2-carboxyethyl)-2-methylpropionamidine] tetrahydrate; cyclic azoamidine type carbon radical generating agent such as, for example, 2,2'-azobis[2-(2-imidazoline-2-yl)propane] dihydrochloride, 2,2'-azobis[2-(2-imidazoline-2-yl)propane] disulfate, 2,2'-azobis[2-(2-imidazoline-2-yl)propane] dihydrate, 2,2'-azobis{2-[1-(2-hydroxyethyl)-2-imidazoline-2-yl]propane}dihydrochloride, 2,2'-azobis[2-(2-imidazoline-2-yl)propane], 2,2'-azobis(1-imino-1-pyrrolidino-2-methylpropane) dihydrochloride; azoester type carbon radical generating agent such as, for example, dimethyl-2,2'-azobis(2-methylpropionate); and a compound which suitably generates carbon radical by light irradiation, such as, for example, benzoin alkyl ether type carbon radical generating agent such as, for example, benzoin methyl ether, benzoin ethyl ether, benzoin isopropyl ether, benzoin isobutyl ether; benzylketal type carbon radical generating agent such as, for example, 2,2-dimethoxy-1,2-diphenylethan-1-on; benzophenone type carbon radical generating agent such as, for example, benzophenone, 4,4'-bisdiethylaminobenzophenone, acrylated benzophenone, methyl benzoylbenzoate, 2-benzoylnaphthalene, 4-benzoylbiphenyl, 4-benzoyldiphenylether, 1,4-dibenzoylbenzene, [4-(methylphenylthio)phenyl]phenylmethane; aminobenzoate ester type carbon radical generating agent such as, for example, ethyl p-dimethylaminobenzoate ester, isoamyl ethyl p-dimethylaminobenzoate ester; 1,2-hydroxyalkylphenone type carbon radical generating agent such as, for example, 2-hydroxy-2-methyl-1-phenylpropan-1-on, 1-[4-(2-hydroxyethoxy)phenyl]-2-hydroxy-2-methyl-1-propan-1-on, 2-hydroxy-1-{4-[4-(2-hydroxy-2-methylpropionyl)benzyl]phenyl}-2-methyl propan-1-on, 1-hydroxycyclohexylphenylketone; 1,2-aminoalkylphenone type carbon radical generating agent such as, for example, 2-methyl-1-(4-methylthiophenyl)-2-morpholinopropan-1-on, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone; methyl)-1-[4-(4-morpholinyl)phenyl]-1-butanone; acylphosphin oxide type carbon radical generating agent such as, for example, 2,4,6-trimethylbenzoylphenylethoxyphosphin oxide, 2,4,6-trimethylbenzoyldiphenylphosphin oxide, bis(2,4,6-trimethylbenzoyl)phenylphosphin oxide; anthraquinone type carbon radical generating agent such as, for example, ethylanthraquinone; thioxanthone type carbon radical generating agent such as, for example, chlorothioxanthone, diethylthioxanthone, isopropylthioxanthone; acridone type carbon radical generating agent such as, for example, 10-butylchloroacridone; imidazole type carbon radical generating agent such as, for example, 2,2'-bis(o-chlorophenyl)-4,5,4',5'-tetraphenyl-1,2'-biimidazole, 2,2'-bis(o-chlorophenyl)-4,5,4',5'-tetrakis(3,4,5-trimethoxyphenyl)-1,2'-biimidazole; oxime ester type carbon radical generating agent such as, for example, 1,2-octandion-1-[4-(phenylthio)-2-(o-benzoyloxime)], ethanon-1-[9-ethyl-6-(2-methylbenzoyl)-9H-carbazol-3-yl]-1-(o-acetyloxime); titanocene type carbon radical generating agent such as, for example, bis(η5-2,4-cyclopentadien-1-yl)-bis(2,6-difluoro-3-(1H-pyrrol-1-yl)phenyl) titanium. Among them, more preferable one is a compound which suitably generates carbon radical by heating, such as, for example, azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine) dihydrochloride, 2,2'-azobis[N-(2-carboxyethyl)-2-methylpropionamidine] tetrahydrate; azoester type carbon radical generating agent such as, for example, dimethyl-2,2'-azobis(2-methylpropionate); and a compound which suitably generates carbon radical by irradiation of light having a wavelength of 200 to 750 nm, such as, for example, benzylketal type carbon radical generating agent such as, for example, 2,2-dimethoxy-1,2-diphenylethan-1-on; 1,2-hydroxyalkylphenone type carbon radical generating agent such as, for example, 2-hydroxy-2-methyl-1-phenylpropan-1-on, 1-[4-(2-hydroxyethoxy)phenyl]-2-hydroxy-2-methyl-1-propan-1-on, 2-hydroxy-1-{4-[4-(2-hydroxy-2-methylpropionyl)benzyl]phenyl}-2-methyl propan-1-on, 1-hydroxycyclohexylphenylketone; 1,2-aminoalkylphenone type carbon radical generating agent such as, for example, 2-methyl-1-(4-methylthiophenyl)-2-morpholinopropan-1-on, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone. In addition, as for these carbon radical generating agents, one kind of compound may be used alone or plural kinds of compounds may be used in combination accordingly.

It should be noted that, among the above-described carbon radical generating agents, some of the compounds suitably generating carbon radical by heating can also generate carbon radical by light irradiation. Azonitrile type carbon radical generating agents, azoamide type carbon radical generating agents, chain-like azoamidine type carbon radical generating agents, cyclic azoamidine type carbon radical generating agents, azoester type carbon radical generating agents, and the like correspond to those which can generate carbon radical by light irradiation, and they can suitably generate carbon radical by irradiation of light having a wavelength of 200 to 750 nm. It should be noted that, a compound, which suitably generates carbon radical by light irradiation, means the one which can easily generate carbon radical by light irradiation, and does not mean the one which does not generate carbon radical by heating. That is, the compound which suitably generates carbon radical by light irradiation is the one which can also generate carbon radical by heating. In addition, these preferable specific examples of carbon radical generating agents are useful from the viewpoints of industrial availability, economical efficiency, and efficient removing of an anti-reflection coating layer in a short time.

By using a composition combined a compound generating a fluoride ion in water and a carbon radical generating agent as mentioned above for treating a semiconductor surface, removing of semiconductor surface layers such as an anti-reflection coating layer can be realized. That is, for the first time, the inventors of the present invention have found that by using a composition comprising these components, a surface layers such as an anti-reflection coating layer provided for producing semiconductors can be removed without carrying out ashing and the like, using a simple and easy method such as dipping. In addition, for the first time, the inventors of the present invention have found a composition which can remove not only a resist layer residue adhering to an anti-reflection coating layer but also even a resist layer itself and a cured resist layer formed on a resist layer surface, together with an anti-reflection coating layer, by further containing other components as described below in addition to these components.

In addition, the carbon radical generating agent to be used in combination with the compound generating a fluoride ion in water is an superior compound which can achieve better removing of treating layers such as an anti-reflection coating layer, compared with a compound which generates oxygen radical such as hydrogen peroxide, ozone, and the like, in addition, can remove the above-described layer without exerting harmful effects on a Low-k film locating at the lower layer of the treating layer and a metal wiring such as copper wiring.

Water to be used in the semiconductor surface treating agent composition of the present invention is not particularly limited, so long as it does not exert any harmful effect on a Low-k film and a metal wiring. An example of the water is purified water, distilled water, ultrapure water, and the like, and among them, ultrapure water is preferable.

It should be noted that, the semiconductor surface treating agent composition of the present invention desirably contains an acid in addition to the components as mentioned above. By adjusting pH of the aqueous solution by containing an acid, for example, not only a harmful effect on an insulation film such as Low-k film locating at the lower layer of an anti-reflection coating layer can be reduced, but also removing of an anti-reflection coating layer in a short time can be realized by facilitating generation of hydrofluoric acid in water of "the compound generating a fluoride ion in water" in the composition.

Here, the above-described acid includes an acid which has an action to reduce pH to an acidic range, and is capable of assisting generation of hydrofluoric acid in water by the compound generating a fluoride ion in water. Specifically, the acid includes, an inorganic acid such as, for example, hydrochloric acid, nitric acid, sulfuric acid, phosphoric acid; an aliphatic monocarboxylic acid such as, for example, formic acid, acetic acid, propionic acid, butyric acid, valeric acid, caproic acid, enanthic acid, caprylic acid, pelargonic acid, capric acid, lauric acid; an aliphatic dicarboxylic acid such as, for example, oxalic acid, malonic acid, succinic acid, glutaric acid, adipic acid, pimelic acid, maleic acid, fumaric acid; an aliphatic hydroxycarboxylic acid such as, for example, lactic acid, malic acid, tartaric acid, citric acid; an aliphatic tricarboxylic acid such as, for example, aconitic acid; an aliphatic oxocarboxylic acid such as, for example, pyruvic acid; an aromatic monocarboxylic acid such as, for example, benzoic acid; an aromatic dicarboxylic acid such as, for example, phthalic acid, isophthalic acid, terephthalic acid; an aromatic hydroxycarboxylic acid such as, for example, salicylic acid, gallic acid; and an aromatic hexacarboxylic acid such as, for example, mellitic acid. It should be noted that, for convenience of explanation, a carboxylic acid having one or more hydroxyl groups in a structure should be classified to the category of hydroxycarboxylic acid regardless of number of the carboxyl group. In addition, hydrofluoric acid itself is an acid, but also corresponds to the above-described compound generating a fluoride ion in water. Since hydrofluoric acid generates hydrofluoric acid in water but does not assist its generation, the hydrofluoric acid should be classified to the category of a compound generating a fluoride ion in water as mentioned above.

Among these acids, inorganic acid, aliphatic dicarboxylic acid, aliphatic hydroxycarboxylic acid, aliphatic tricarboxylic acid, aromatic dicarboxylic acid, aromatic hydroxycarboxylic acid, and aromatic hexacarboxylic acid are preferable from the viewpoints of solubility to water, and among them, aliphatic dicarboxylic acid, aliphatic hydroxycarboxylic acid, aromatic dicarboxylic acid, and aromatic hydroxycarboxylic acid are more preferable from the viewpoints of easy handling, industrial availability, economical efficiency, and the like, among them, oxalic acid, malonic acid, succinic acid, glutaric acid, adipic acid, pimelic acid, maleic acid, fumaric acid, malic acid, tartaric acid, citric acid, and phthalic acid are further preferable, and further among them, oxalic acid, malic acid, tartaric acid, and citric acid are particularly preferable. It should be noted that, when a semiconductor substrate provided with a metal wiring, which is susceptible to harmful effect of an inorganic acid, such as multilayer copper wiring structure, is treated, coexistence of an inorganic acid such as, for example, hydrochloric acid, nitric acid, sulfuric acid, phosphoric acid in the composition of the present invention sometimes causes deterioration of electric characteristics of a semiconductor substrate. Therefore, in such a case, use of the inorganic acid is not preferable. In addition, as for these acids, one kind of acid may be used alone or plural kinds of acids may be used in combination accordingly.

In addition, the semiconductor surface treating agent composition of the present invention desirably contains an organic solvent in addition to the components as mentioned above. By containing an organic solvent, in addition to an anti-reflection coating layer, a resist layer and even a cured resist layer produced in an etching process, which is said to be more difficult to be removed than the resist layer, can be effectively removed.

Here, the above-described organic solvent includes an organic solvent which is capable of removing a resist layer without giving any effect on removing of an anti-reflection coating layer, specifically includes an organic solvent of alcohol type, ester type, amide type or sulfoxide type, such as an alcohol type solvent such as, for example, methanol, ethanol, isopropyl alcohol, 1-methoxy-2-propanol, ethylene glycol; an ester type solvent such as, for example, ethyl acetate, propyl acetate, isobutyl acetate, ethyl lactate, diethyl oxalate, diethyl tartrate, γ-butyrolactone; an amide type solvent such as, for example, N-methylpyrrolidone; a sulfoxide type solvent such as, for example, dimethyl sulfoxide, which has a dipole moment of 1.5 to 7.5 debye, and a specific gravity in a range from 0.7 to 1.2. Among these organic solvents, isopropyl alcohol, ethylene glycol, γ-butyrolactone, and N-methylpyrrolidone are preferable, because these solvents can realize removing of a resist layer in a short time and even removing of a cured resist layer produced in an etching process which is said to be more difficult to be removed than the resist layer, and among them, isopropyl alcohol, γ-butyrolactone, and N-methylpyrrolidone are further preferable. In addition, as for these organic solvent, one kind of solvent may be used alone or plural kinds of solvents may be used in combination accordingly. As an organic solvent in the semiconductor surface treating agent composition of the present invention, a combination of isopropyl alcohol and γ-butyrolactone and a combination of isopropyl alcohol and N-methylpyrrolidone are further preferable. It should be noted that, when a plural types of organic solvents are used in combination, the above-described dipole moment or specific gravity of an organic solvent is not a dipole moment or a specific gravity of the mixed solvent obtained but mean that each organic solvent itself in combination has a dipole moment of 1.5 to 7.5 debye, or each organic solvent itself has a specific gravity in a range from 0.7 to 1.2.

Further, the semiconductor surface treating agent composition of the present invention desirably further contains a reducing agent in addition to the components as mentioned above. By further containing a reducing agent, removing of a cured resist layer in a shorter time can be realized due to its reducing action.

Here, the above-described reducing agent includes a reducing agent which is commonly used in this field, specifically, includes, for example, hydrazine or derivatives thereof; sulfite salt such as, for example, sodium sulfite, ammonium sulfite; thiosulfite salt such as, for example, sodium thiosulfite, ammonium thiosulfite; aldehyde such as, for example, formaldehyde, acetoaldehyde; carboxylic acid having reducing property such as, for example, formic acid, oxalic acid, succinic acid, lactic acid, malic acid, citric acid, pyruvic acid; ascorbic acid derivatives such as, for example, ascorbic acid or ascorbic acid ester, isoascorbic acid or isoascorbic acid ester; monosaccharide, such as, five-carbon sugar having reducing property such as, for example, arabinose, xylose, ribose, and six-carbon sugar having reducing property such as, for example, glucose, mannose, fructose, galactose. It should be noted that, among the above-described reducing agents, since a carboxylic acid having reducing property such as, for example, formic acid, oxalic acid, succinic acid, lactic acid, malic acid, citric acid, pyruvic acid, also exhibits an action as an acid as mentioned above, these carboxylic acids having reducing property can be used alone, as two components of acid and reducing agent.

Here, the above-described hydrazine derivatives includes a compound such as, for example, hydrazine sulfate, hydrazine monohydrochloride; in addition, the above-described ascorbic acids ester includes a compound such as, for example, ascorbyl stearate, ascorbyl palmitate, ascorbyl dipalmitate, ascorbyl tetrahexyldecanoate, ascorbyl glucoside; and further the above-described isoascorbic acid ester includes a compound such as, for example, isoascorbyl stearate, isoascorbyl palmitate, isoascorbyl dipalmitate, isoascorbyl tetrahexyldecanoate, isoascorbyl glucoside. It should be noted that, among ascorbic acids ester or isoascorbic acid ester, in the case of an ascorbic acid ester including an alkali metal or an alkaline-earth metal, such as, for example, sodium ascorbate, sodium sulfate ascorbate, sodium phosphate ascorbate, magnesium phosphate ascorbate, since these alkali metal or alkaline-earth metal sometimes causes deterioration of electric characteristics on a semiconductor substrate, use of the above-described ascorbic acid esters including alkali metal and the like is not preferable.

In the reducing agents mentioned above, ascorbic acid derivatives such as, for example, ascorbic acid or ascorbic acid ester, isoascorbic acid or isoascorbic acid ester, are preferable from the viewpoints of adequate reducing property, industrial availability, economic efficiency, and the like, and among them, ascorbic acid or ascorbic acid ester is more preferable, among them, ascorbyl palmitate is further preferable. In addition, as for these reducing agents, one kind of compound may be used alone or plural kinds of compounds may be used in combination accordingly.

Furthermore, the semiconductor surface treating agent composition of the present invention may contain a surfactant in addition to the components as mentioned above. By containing a surfactant, solubilization of a compound generating a fluoride ion in water and a reducing agent is assisted, and effects of the compound generating a fluoride ion in water and the reducing agent can be further enhanced.

Here, the above-described surfactant includes cationic surfactant, anionic surfactant, nonionic surfactant and amphoteric surfactant which are commonly used in this field. Cationic surfactant specifically includes primary to tertiary alkylamine salts such as, for example, monostearylammonium chloride, distearylammonium chloride, tristearylammonium chloride; quaternary alkylammonium salts such as, for example, monostearyltrimethylammonium chloride, distearyldimethylammonium chloride, stearyldimethylbenzylammonium chloride, monostearyl-bis(polyethoxy)methylammonium chloride; alkylpyridinium salts such as, for example, N-cetylpyridinium chloride, N-stearylpyridinium chloride; N,N-dialkylmorpholinium salts; and fatty acid amide salts such as, for example, polyethylene polyamine, and the like. In addition, anionic surfactant specifically includes anionic surfactants having a carboxyl group in a molecule, such as, for example, sodium salt of alkylcarboxylic acid, potassium salt of alkylcarboxylic acid, ammonium salt of alkylcarboxylic acid, sodium salt of alkylbenzenecarboxylic acid, potassium salt of alkylbenzenecarboxylic acid, ammonium salt of alkylbenzenecarboxylic acid, sodium salt of polyoxyalkylene alkyl ether carboxylic acid, potassium salt of polyoxyalkylene alkyl ether carboxylic acid, ammonium salt of polyoxyalkylene alkyl ether carboxylic acid, sodium salt of N-acylsarcosine acid, potassium salt of N-acylsarcosine acid, ammonium salt of N-acylsarcosine acid, sodium salt of N-acylglutamic acid, potassium salt of N-acylglutamic acid, ammonium salt of N-acylglutamic acid; anionic surfactants having a sulfonic acid group in a molecule, such as, for example, sodium salt of alkylsulfonic acid, potassium salt of alkylsulfonic acid, ammonium salt of alkylsulfonic acid, sodium salt of alkylbenzenesulfonic acid, potassium salt of alkylbenzenesulfonic acid, ammonium salt of alkylbenzenesulfonic acid, sodium salt of alkylnaphthalenesulfonic acid, potassium salt of alkylnaphthalenesulfonic acid, ammonium salt of alkylnaphthalenesulfonic acid, sodium salt of polyoxyalkylene alkyl ether sulfonic acid, potassium salt of polyoxyalkylene alkyl ether sulfonic acid, ammonium salt of polyoxyalkylene alkyl ether sulfonic acid, sodium salt of N-methyl-N-acyltaurine, potassium salt of N-methyl-N-acyltaurine, ammonium salt of N-methyl-N-acyltaurine, sodium salt of dialkyl sulfosuccinate, potassium salt of dialkyl sulfosuccinate, ammonium salt of dialkyl sulfosuccinate; anionic surfactants having a phosphonic acid group in a molecule, such as, for example, sodium salt of alkylphosphonic acid, potassium salt of alkylphosphonic acid, ammonium salt of alkylphosphonic acid, sodium salt of alkylbenzenephosphonic acid, potassium salt of alkylbenzenephosphonic acid, ammonium salt of alkylbenzenephosphonic acid, sodium salt of polyoxyalkylene alkyl ether phosphonic acid, potassium salt of polyoxyalkylene alkyl ether phosphonic acid, ammonium salt of polyoxyalkylene alkyl ether phosphonic acid, and the like. Further, nonionic surfactant specifically includes polyoxyethylene alkyl ethers such as, for example, polyoxyethylene stearyl ether; polyoxyethylene alkenyl ethers such as, for example, polyoxyethylene oleyl ether; polyoxyalkylene alkylphenyl ethers such as, for example, polyoxyethylene nonylphenyl ether; polyoxyalkylene glycols such as, for example, polyoxypropylene polyoxyethylene glycol; polyoxyethylene monoalkylates such as, for example, polyoxyethylene monostearate; bispolyoxyethylene alkylamines such as, for example, bispolyoxyethylene stearylamine; bispolyoxyethylene alkylamides such as, for example, bispolyoxyethylene stearylamide; alkylamine oxides such as, for example, N,N-dimethylalkylamine oxide, and the like. Furthermore, amphoteric surfactants specifically includes carboxybetaines such as, for example, betaine alkyl-N,N-dimethylaminoacetate, betaine alkyl-N,N-dihydroxyethylaminoacetate; sulfobetaines such as, for example, alkyl-N,N-dimethylsulfoethylene ammonium betaine; imidazolinium betaines such as, for example, 2-alkyl-N-carboxymethyl-N-hydroxyethylimidazolinium betaine, and the like.

Among the surfactants mentioned above, from the viewpoints of solubilizing ability to the compound generating a fluoride ion in water and the reducing agent, industrial availability, economical efficiency, and the like, anionic surfactants having a carboxyl group in a molecule, such as, for example, sodium salt of alkylcarboxylic acid, potassium salt of alkylcarboxylic acid, ammonium salt of alkylcarboxylic acid, sodium salt of alkylbenzenecarboxylic acid, potassium salt of alkylbenzenecarboxylic acid, ammonium salt of alkylbenzenecarboxylic acid, sodium salt of polyoxyalkylene alkyl ether carboxylic acid, potassium salt of polyoxyalkylene alkyl ether carboxylic acid, ammonium salt of polyoxyalkylene alkyl ether carboxylic acid, sodium salt of N-acylsarcosine acid, potassium salt of N-acylsarcosine acid, ammonium salt of N-acylsarcosine acid, sodium salt of N-acylglutamic acid, potassium salt of N-acylglutamic acid, ammonium salt of N-acylglutamic acid; anionic surfactants having a sulfonic acid group in a molecule, such as, for example, sodium salt of alkylsulfonic acid, potassium salt of alkylsulfonic acid, ammonium salt of alkylsulfonic acid, sodium salt of alkylbenzenesulfonic acid, potassium salt of alkylbenzenesulfonic acid, ammonium salt of alkylbenzenesulfonic acid, sodium salt of alkylnaphthalenesulfonic acid, potassium salt of alkylnaphthalenesulfonic acid, ammonium salt of alkylnaphthalenesulfonic acid, sodium salt of polyoxyalkylene alkyl ether sulfonic acid, potassium salt of polyoxyalkylene alkyl ether sulfonic acid, ammonium salt of polyoxyalkylene alkyl ether sulfonic acid, sodium salt of N-methyl-N-acyltaurine, potassium salt of N-methyl-N-acyltaurine, ammonium salt of N-methyl-N-acyltaurine, sodium salt of dialkyl sulfosuccinate, potassium salt of dialkyl sulfosuccinate, ammonium salt of dialkyl sulfosuccinate; and anionic surfactants having a phosphonic acid group in a molecule, such as, for example, sodium salt of alkylphosphonic acid, potassium salt of alkylphosphonic acid, ammonium salt of alkylphosphonic acid, sodium salt of alkylbenzenephosphonic acid, potassium salt of alkylbenzenephosphonic acid, ammonium salt of alkylbenzenephosphonic acid, sodium salt of polyoxyalkylene alkyl ether phosphonic acid, potassium salt of polyoxyalkylene alkyl ether phosphonic acid, ammonium salt of polyoxyalkylene alkyl ether phosphonic acid; and nonionic surfactants, such as, for example, polyoxyethylene alkyl ethers such as, for example, polyoxyethylene stearyl ether; polyoxyethylene alkenyl ethers such as, for example, polyoxyethylene oleyl ether; polyoxyalkylene alkylphenyl ethers such as, for example, polyoxyethylene nonylphenyl ether; polyoxyalkylene glycols such as, for example, polyoxypropylene polyoxyethylene glycol; polyoxyethylene monoalkylates such as, for example, polyoxyethylene monostearate; bispolyoxyethylene alkylamines such as, for example, bispolyoxyethylene stearylamine; bispolyoxyethylene alkylamides such as, for example, bispolyoxyethylene stearylamide; alkylamine oxides such as, for example, N,N-dimethylalkylamine oxide, and the like. Among them, anionic surfactants having a sulfonic acid group in a molecule, such as, for example, sodium salt of alkylsulfonic acid, potassium salt of alkylsulfonic acid, ammonium salt of alkylsulfonic acid, sodium salt of alkylbenzenesulfonic acid, potassium salt of alkylbenzenesulfonic acid, ammonium salt of alkylbenzenesulfonic acid, sodium salt of alkylnaphthalenesulfonic acid, potassium salt of alkylnaphthalenesulfonic acid, ammonium salt of alkylnaphthalenesulfonic acid, sodium salt of polyoxyalkylene alkyl ether sulfonic acid, potassium salt of polyoxyalkylene alkyl ether sulfonic acid, ammonium salt of polyoxyalkylene alkyl ether sulfonic acid, sodium salt of N-methyl-N-acyltaurine, potassium salt of N-methyl-N-acyltaurine, ammonium salt of N-methyl-N-acyltaurine, sodium salt of dialkyl sulfosuccinate, potassium salt of dialkyl sulfosuccinate, ammonium salt of dialkyl sulfosuccinate, and the like; are more preferable. In addition, as for these surfactants, one kind of surfactant may be used alone or plural kinds of surfactants may be used in combination accordingly.

In the semiconductor surface treating agent composition of the present invention, explanation will be given for concentration of each component in the composition in the case when subject of the treatment is only removing of an anti-reflection coating layer. That is, when only removing of an anti-reflection coating layer is carried out, three components of a compound generating a fluoride ion in water, a carbon radical generating agent and water may be contained in the composition. As for concentrations of these components required for removing of an anti-reflection coating layer based on the total weight of the composition as 100% by weight, concentration of the compound generating a fluoride ion in water is generally 0.01 to 5% by weight, and preferably 0.01 to 1% by weight; concentration of the carbon radical generating agent is generally 0.05 to 10% by weight, and preferably 0.1 to 2% by weight, and concentration of water is generally 85 to 99.94% by weight, and preferably 97 to 99.89% by weight. It should be noted that, in order to facilitate generation of hydrofluoric acid in water by the "a compound generating a fluoride ion in water", further desirably an acid may be contained, and concentration of the acid is generally 0.05 to 5% by weight, and preferably 0.05 to 3% by weight. By setting concentrations of these components within the above-described ranges, good removing of the anti-reflection coating layer can be carried out. In particular, by setting concentration of each component within the above-described preferable range, removing of the anti-reflection coating layer can be realized in a shorter time.

On the other hand, in the semiconductor surface treating agent composition of the present invention, explanation will be given for concentration of each component in the composition in the case when subject of the treatment is not only removing of an anti-reflection coating layer but also removing of a resist layer and a cured resist layer together with an anti-reflection coating layer. When removing of a resist layer and a cured resist layer in addition to an anti-reflection coating layer is carried out at the same time, desirably the composition contains an organic solvent mentioned above, and if necessary, further contains a reducing agent, a surfactant, and the like. Hereinafter, concentrations of a compound generating a fluoride ion in water, a carbon radical generating agent, water, an acid, an organic solvent, a reducing agent and a surfactant in the composition will be explained.

Concentration of the compound generating a fluoride ion in water in the semiconductor surface treating agent composition of the present invention is generally 0.01 to 5% by weight, and preferably 0.01 to 1% by weight, as a concentration of the compound generating a fluoride ion based on the total weight of the composition.

Concentration of the carbon radical generating agent in the semiconductor surface treating agent composition of the present invention is generally 0.05 to 10% by weight, and preferably 0.1 to 2% by weight, as a concentration of the carbon radical generating agent based on the total weight of the composition.

Concentration of water in the semiconductor surface treating agent composition of the present invention is generally 0.02 to 10% by weight, and preferably 0.03 to 5% by weight, as a concentration of the water based on the total weight of the composition.

Concentration of the acid in the semiconductor surface treating agent composition of the present invention is generally 0.1 to 5% by weight, and preferably 0.1 to 1% by weight, as a concentration of the acid based on the total weight of the composition.

Concentration of the organic solvent in the semiconductor surface treating agent composition of the present invention is generally 80 to 99% by weight, and preferably 90 to 99% by weight, as a concentration of the organic solvent based on the total weight of the composition.

Concentration of the reducing agent in the semiconductor surface treating agent composition of the present invention is generally 0.001 to 5% by weight, and preferably 0.001 to 1% by weight, as a concentration of the reducing agent based on the total weight of the composition.

Concentration of the surfactant in the semiconductor surface treating agent composition of the present invention is generally 0.05 to 5% by weight, and preferably 0.1 to 3% by weight, as a concentration of the surfactant based on the total weight of the composition.

Since the semiconductor surface treating agent composition of the present invention contains water, and optionally further an organic solvent, the composition can be provided as it is for use for treatment of the semiconductor surface; however, desirably pH range of the composition is generally 11 or lower to maintain a certain level of removing performance. In particular, when the layer under the layer to be removed is, for example, a Low-k film, a composition may cause a hollow on the semiconductor substrate or a slit in the Low-k film because the Low-k film dissolves under alkaline atmosphere. Therefore, in order to exclude a possibility to give harmful effect on the Low-k film, pH of the composition is preferably acidic to neutral, and range thereof is 7 or lower, and more preferably 1 to 4. It should be noted that, pH may be set appropriately to be in the above-described range, by properly selecting or adjusting kind or concentration of the acid.

To the semiconductor surface treating agent composition of the present invention, in addition to the above-described components, a component which does not impair the effect of the present invention such as, for example, metal corrosion inhibitor or the like may be added accordingly, if necessary.

The metal corrosion inhibitor specifically includes, for example, benzotriazole or benzotriazole derivatives such as, for example, carboxybenzotriazole, aminobenzotriazole; thiourea compounds such as thiourea; thiol compounds such as, for example, mercaptothiazole, mercaptoethanol, thioglycerol; carboxylic acid derivatives such as, for example, quinoline carboxylic acid; and the like. In addition, as for these metal corrosion inhibitors, one kind of inhibitor may be used alone or plural kinds of inhibitors may be used in combination accordingly.

Method for preparing the semiconductor surface treating agent composition of the present invention is not particularly limited, so long as the method is the one which is commonly used in this field. When a composition for removing only an anti-reflection coating layer is prepared, for example, the semiconductor surface treating agent composition of the present invention may be prepared by adding a compound generating a fluoride ion in water and a carbon radical generating agent to a solvent of a predetermined amount of water, and stirring the mixture at room temperature, and if necessary, further adding an acid thereto to adjust pH of the solution to a desired level. On the other hand, when a composition for removing not only an anti-reflection coating layer but also a resist layer and a cured resist layer together with an anti-reflection coating layer at the same time is prepared, the semiconductor surface treating agent composition of the present invention may be prepared by adding a compound generating a fluoride ion in water and a carbon radical generating agent to a solvent of a predetermined amount of water, and stirring the mixture at room temperature, then adding an organic solvent to the solution while stirring is continued, and if necessary, further adding a reducing agent, a surfactant, an acid to adjust pH of the solution to a desired level. It should be noted that, when a compound generating a carbon radical by light irradiation is used as a carbon radical generating agent, the above-described preparation is desirably carried out under a lighting by a yellow lamps or the like where the light having a wavelength in a specified range required by the carbon radical generating agent to generate carbon radical has been cut out or in the dark.

Next, method for treating the semiconductor surface on which an anti-reflection coating layer and the like has been provided using the semiconductor surface treating agent composition of the present invention, that is, a preferable means to implement a method for removing an anti-reflection coating layer will be explained.

Substrate which is a subject of the method for treating semiconductor surface of the present invention is a substrate and the like generally produced in a production process of semiconductor devices, liquid crystal devices, and the like, wherein at least an anti-reflection coating layer has been coated on a upper layer of a wafer provided with a metal wiring and an insulation film such as, for example, Low-k film.

Here, the anti-reflection coating layer includes top anti-reflection coating (TARC) layer, bottom anti-reflection coating (BARC) layer, and the like. As mentioned above, the semiconductor surface treating agent composition of the present invention is the one which can realize even removing of a resist layer which has become difficult to be removed because surface of the resist layer has been cured by etching in an etching process in a production process of semiconductor devices, that is, a cured resist layer. Since the composition can effectively perform removing of a resist layer and a cured resist layer coated on the anti-reflection coating layer, the anti-reflection coating layer may be a bottom anti-reflection coating (BARC) layer. It should be noted that, it goes without saying that the semiconductor surface treating agent composition of the present invention can remove together with the resist layer even it is the anti-reflection coating layer coated on the resist layer (top anti-reflection coating (TARC) layer), if appropriate composition is used.

In addition, the Low-k film used herein includes, for example, fluorine-containing silicon dioxide film and the like coated on the lower layer of the treating layers such as an anti-reflection coating layer or a resist layer, and means an insulation film (including a porous Low-k film and a Ultra Low-k film) having a specific inductive capacity of 4 or less, and preferably 3 or less.

Here, as a substrate which is a subject of the method for treating semiconductor surface of the present invention, taking, for example, a substrate in which an anti-reflection coating layer has been coated on the upper layer of a wafer provided with a metal wiring or an insulation film, and the like (the one intending removing of only an anti-reflection coating layer), and, for example, a substrate in which a cured resist layer has been formed by etching a substrate in which a resist layer is coated on the upper layer of the above-described anti-reflection coating layer (the one intending removing of not only an anti-reflection coating layer but also even a resist layer and a cured resist layer) as examples, the treatment method will be explained.

Firstly, when only removing of an anti-reflection coating layer is intended, a solution of a composition, which is prepared by containing, for example, a compound generating a fluoride ion in water, a carbon radical generating agent, water, and if necessary, further an acid each in a predetermined concentration range as mentioned above, is provided as the semiconductor surface treating agent composition of the present invention. After that, a substrate which has been coated with the above-described anti-reflection coating layer may be dipped in this solution generally for 1 to 30 minutes, and preferably for 1 to 5 minutes, while the substrate is irradiated by light having a wavelength of generally 200 to 750 nm, and preferably 200 to 450 nm or heated generally at 30 to 70° C., and preferably at 30 to 50° C. By carrying out these procedures, removing of the anti-reflection coating layer can be realized.

Next, when removing of not only an anti-reflection coating layer but also even a resist layer and a cured resist layer is intended, a solution of a composition, which is prepared by containing a compound generating a fluoride ion in water, a carbon radical generating agent, water, an organic solvent, and if necessary, further an acid, a reducing agent, a surfactant, and the like each in a predetermined concentration range as mentioned above, is provided as the semiconductor surface treating agent composition of the present invention. After that, a substrate on which the above-described cured resist layer has been formed may be dipped in this solution generally for 1 to 30 minutes, and preferably for 1 to 5 minutes, while the substrate is irradiated by light having a wavelength of generally 200 to 750 nm, and preferably 200 to 450 nm or heated generally at 30 to 70° C., and preferably at 30 to 50° C. By carrying out these procedures, removing of not only an anti-reflection coating layer but also even a resist layer and a cured resist layer, that is, treatment of the semiconductor surface can be realized.

Here, if the method by light irradiation instead of heating is employed as a radical generating method during dipping, such advantages can be obtained that the process is advantageous in view of cost-performance, that radical generation of the carbon radical generating agent can be easily controlled, also that an insulation film such as Low-k film and the like is less affected, and so on. Therefore, by employing irradiation of the light having the above-described preferable wavelength and carrying out the dipping for the above-described time, a more efficient treatment of a semiconductor surface can be realized in a shorter time. It should be noted that, when the dipping method using light irradiation is employed, the light irradiation may be continued for whole period of the dipping, or the composition which has been irradiated by light in advance may be used as a dipping solution. In addition, when the dipping method using light irradiation is employed, it goes needless to say that although the dipping temperature may be room temperature, light irradiation and heating can be used together by heating. Furthermore, in the dipping, the substrate on which the above-described cured resist layer has been formed may be stood still for whole period of the dipping, or may be dipped while transferred with a conveyor or the like. Alternatively, the composition may be sprayed instead of dipping. In addition, in the dipping, the dipping may be carried out while the composition is bubbled with nitrogen gas or the like. It should be noted that, as for apparatuses and devices required for dipping, spraying, heating, light irradiation, bubbling, and the like, those which are commonly used in this field can be sufficiently employed.

As described above, the treatment method was explained taking a substrate on which only an anti-reflection coating layer has been coated or a substrate on which a resist layer has been coated on an anti-reflection coating layer and a cured resist layer has been formed thereon, as an example of the substrate which is a subject of the treatment method. Of course, among the above-described substrates on which a cured resist layer has been formed, for example, for a substrate on which only a cured resist layer and a resist layer have been removed and only an anti-reflection coating layer has been remained as a treatment layer, removing of an anti-reflection coating layer, that is, treatment of the semiconductor surface is also possible, if the above-described method, that is, the method intending the removing of only an anti-reflection coating layer is employed accordingly. In addition, for a substrate on which an anti-reflection coating layer and a resist layer have been coated but the above-described cured resist layer is not present, removing of both layers of an anti-reflection coating layer and a resist layer, that is, treatment of the semiconductor surface is also possible, if the above-described method, that is, the method intending removing of not only an anti-reflection coating layer but also even a resist layer and a cured resist layer is employed accordingly. Further, since the semiconductor surface treating agent composition of the present invention does not include any component which causes harmful effects on a metal wiring, such as, for example, a compound which generates oxygen radical such as an oxygen radical generating agent, the composition is effective, for example, to treatment of a semiconductor substrate having a multilayer copper wiring structure, and the above-described treatment method can be employed for the semiconductor substrate having a multilayer copper wiring structure.

Thus, the treatment method of the present invention is an excellent method which can perform removing of not only an anti-reflection coating layer but also even a resist layer and a cured resist layer at the same time only by dipping with heating and light irradiation, without requiring the conventional ashing process and cleaning (removing) process for residue of an ashed resist layer and an anti-reflection coating layer remaining after the ashing process.

Hereinafter, the present invention will be specifically explained referring to Examples and Comparative Examples, but the present invention is not limited thereto by any means.

It should be noted that, % in the following Examples is weight-based (w/w %), unless otherwise specified.

EXAMPLES

As a substrate sample for evaluation, a substrate sample, in which an anti-reflection coating layer (BARC layer) was coated on a silicon wafer of a side of 300 mm and a resist layer was coated on the upper layer of the anti-reflection coating layer, was used. This substrate sample was subjected to dry etching by ion sputtering to form a cured resist layer on the surface of the resist layer to obtain a substrate with a cured resist layer. After that, this substrate was cut out to small pieces of 20 mm×20 mm, and the chip of substrate was used as a substrate sample for evaluation.

Example 1

Preparation of a Semiconductor Surface Treating Agent Composition (1) of the Present Invention Water (1.94 g) and sodium alkylsulfosuccinate (Neocol P, produced by Dai-ichi Kogyo Seiyaku Co., Ltd.) (1.29 g) were charged into a 200 mL plastic beaker. Into this solution, ammonium fluoride (0.06 g) and 2-benzyl-2-dimethylamino-1-(4-morpholinophenyl)-butanone-1 (Irgacure 369, produced by Ciba Specialty Chemicals) (0.5 g) were added, and the mixture was stirred at room temperature under irradiation of Yellow Lamp (straight tube yellow fluorescent lamp FLR40SY-IC/M, manufactured by Mitsubishi Electric OSRAM Ltd.). After dissolution of ammonium fluoride and Irgacure 369 was confirmed, γ-butyrolactone (96 g) was added into the solution while stirring was continued, and ascorbyl palmitate (0.01 g) was further added. After that, citric acid (0.2 g) was added to adjust pH at 2, to obtain a composition of the present invention (1).

Examples 2 to 11

Preparations of Semiconductor Surface Treating Agent Compositions (2) to (11) of the Present Invention In Examples 2 to 11, the compositions of the present invention (2) to (11) were obtained in the same way as in Example 1, except that each component shown in Table 1 was used in a charge amount shown in Table 1. Compositions of composition of the present invention (1) to (11) are shown in Table 1. Numerical values shown in Table 1 are % concentrations of each component based on the total weight of the composition as 100%.

TABLE 1

| | | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| | | Composition of the present invention | | | | | | | | | | |
| | | (1) | (2) | (3) | (4) | (5) | (6) | (7) | (8) | (9) | (10) | (11) |
| Compound generating a fluoride ion in water | Ammonium fluoride | 0.06 | 0.06 | 0.06 | 0.06 | 0.06 | 0.06 | 0.06 | 0.06 | 0.06 | 0.06 | 0.06 |
| Carbon radical generating agent | Irgacure 369 | 0.5 | 0.5 | 0.5 | 0.5 | 0.5 | 0.5 | 0.5 | 0.5 | 0.5 | | |
| | VA-057 | | | | | | | | | | 0.5 | |
| | V-70 | | | | | | | | | | | 0.5 |
| Water | Water | 1.94 | 1.94 | 1.94 | 1.94 | 1.94 | 2.14 | 1.94 | 1.94 | 1.94 | 1.94 | 1.94 |
| Organic solvent | γ-butyrolactone | 96 | 66 | 51 | 51 | 51 | 51 | 51 | | 51 | 51 | 51 |
| | N-methylpyrrolidone | | | | | | | | 51 | | | |
| | Isopropyl alcohol | | 30 | 45 | 45 | 45 | 45 | 45 | 45 | 45 | 45 | 45 |
| Acid | Citric acid | 0.2 | 0.2 | 0.2 | | | | | 0.2 | 0.2 | 0.2 | 0.2 |
| | Sulfuric acid | | | | 0.2 | | | | | | | |
| | Hydrochloric acid | | | | | 0.2 | | | | | | |
| | Disodium citrate | | | | | | | 0.2 | | | | |
| Reducing agent | Ascorbyl palmitate | 0.01 | 0.01 | 0.01 | 0.01 | 0.01 | 0.01 | 0.01 | 0.01 | 0.01 | 0.01 | 0.01 |
| Surfactant | Neocol P | 1.29 | 1.29 | 1.29 | 1.29 | 1.29 | 1.29 | 1.29 | 1.29 | | 1.29 | 1.29 |
| | NCW-1004 | | | | | | | | | 1.29 | | |
| | pH | 2 | 2 | 2 | 2 | 2 | 6 | 4 | 2 | 2 | 2 | 2 |

Irgacure 369: 2-Benzyl-2-dimethylamino-1-(4-morpholinophenyl)-butanone-1
VA-057: 2,2'-Azobis[N-(2-carboxyethyl)-2-methylpropionamidine] tetrahydrate
V-70: 2,2'-Azobis(4-methoxy-2,4-dimethylvaleronitrile)
Neocol P: Sodium alkylsulfosuccinate
NCW-1004: Polyoxyalkylene alkylphenyl ether Comparative Examples 1 to 3

Preparations of Comparative Compositions (1) to (3)

In Comparative Examples (1) to (2), comparative compositions (1) to (2) were obtained in the same way as in Example 1, except that acetone or dimethyl formamide (DMF) was used in a charge amount shown in Table 2, instead of γ-butyrolactone which is an organic solvent in the composition of the present invention. In Comparative Example 3, comparative composition (3) was obtained in the same way as in Example 1, except that hydrogen peroxide was used in a charge amount shown in Table 2, instead of the carbon radical generating agent in the composition of the present invention. Compositions of Comparative Examples (1) to (3) are shown in Table 2. Numerical values shown in Table 2 are % concentrations of each component based on the total weight of the composition as 100%.

TABLE 2

| | | Comparative Example | | |
|---|---|---|---|---|
| | | 1 | 2 | 3 |
| | | Comparative composition | | |
| | | (1) | (2) | (3) |
| Fluorine source | Ammonium fluoride | 0.06 | 0.06 | 0.06 |
| Radical generating agent (Radical source) | Irgacure 369 | 0.5 | 0.5 | |
| | Hydorgen peroxide | | | 1 |
| Water | Water | 1.94 | 1.94 | 5 |
| Solvent | γ-butyrolactone | | | 66 |
| | Acetone | 51 | | |
| | DMF | | 51 | |
| | Isopropyl alcohol | 45 | 45 | 26.44 |
| Acid | Citric acid | 0.2 | 0.2 | 0.2 |
| Reducing agent | Ascorbyl pulmitate | 0.01 | 0.01 | 0.01 |
| Surfactant | Neocol P | 1.29 | 1.29 | 1.29 |
| | pH | 2 | 4 | 2 |

Irgacure 369: 2-Benzyl-2-dimethylamino-1-(4-morpholinophenyl)-butanone-1
DMF: Dimethylformamide
Neocol P: Sodium alkylsulfosuccinate Example 12

Evaluation of the Semiconductor Surface Treating Agent Composition (1) of the Present Invention The composition of the present invention (1) (50 mL) prepared in Example 1 was poured into a 200 mL plastic beaker. The above-described substrate sample for evaluation was kept dipped therein at room temperature for 30 minutes under gentle stirring, while the substrate sample was irradiated by light having a center wavelength of 320 nm using an ultraviolet irradiation apparatus (Ultraviolet Irradiation apparatus MUV-35U with MUV-PF001 filter, manufactured by MORITEX Corp.). After that, the substrate sample was rinsed with pure water for 30 seconds, and the substrate surface was dried by compressed air. From visual observation of the substrate sample after drying, it was confirmed that the resist layer and the cured resist layer could be well removed without remaining residue, and that 90% or more of the anti-reflection coating layer could be removed. Consequently, it was found that by dipping the substrate sample for evaluation in the composition of the present invention for 30 minutes, not only an anti-reflection coating layer (BARC layer) but also even a resist layer and a cured resist layer could be removed at the same time.

Examples 13 to 20

Evaluations of Semiconductor Surface Treating Agent Composition (2) to (9) of the Present Invention In Examples 13 to 20, compositions of the present invention (2) to (9) were dipped for a predetermined time by the same method as in Example 12 to visually observe removing performances for a resist layer, a cured resist layer and an anti-reflection coating layer. The results are shown in Table 3 together with the result of Example 12. It should be noted that, In Example 17, it was confirmed that crystal of ammonium fluoride deposited in the solution during the dipping.

TABLE 3

| Example | Composition of the present invention | Dipping time | Resist layer | Cured resist layer | Anti-reflection coating layer |
|---|---|---|---|---|---|
| 12 | (1) | 30 min. | ◎ | ◎ | ◎ |
| 13 | (2) | 3 min. | ◎ | ◎ | ◎ |
| 14 | (3) | 3 min. | ◎ | ◎ | ◎ |
| 15 | (4) | 3 min. | ◎ | ◎ | ◎ |
| 16 | (5) | 3 min. | ◎ | ◎ | ◎ |
| 17 | (6) | 15 min. | ◎ | ◎ | ○ |
| 18 | (7) | 3 min. | ◎ | ◎ | ◎ |
| 19 | (8) | 4 min. | ◎ | ◎ | ◎ |
| 20 | (9) | 3 min. | ◎ | ◎ | ◎ |

◎: 90% or more removed
○: 30% or more but less than 90% removed

From the results of Examples 12 to 20, it was found that in any compositions in which the carbon radical generating agent was a compound (photo radical generating agent) suitably generating a carbon radical by light irradiation, not only the anti-reflection coating layer (BARC layer) but also even the resist layer and the cured resist layer could be well removed. In addition, from the results of Examples 13 to 16 and 18 to 20, it was found that by using, for example, a mixed solvent of γ-butyrolactone and isopropyl alcohol or a mixed solvent of N-methylpyrrolidone and isopropyl alcohol as an organic solvent, the above-described layers could be well removed within 5 minutes, and that by selecting an appropriate organic solvent, a composition having a superior removing performance in a short time could be provided. Further, from the comparison of the results of Example 17 (the composition of the present invention (6) was used) with the results of Examples 13 to 16 and 18 to 20, it was found that by assisting dissolution of ammonium fluoride by adding an acid and by acidifying the composition having pH of 4 or less, removing could be realized in a short time.

Example 21

Evaluation of the Semiconductor Surface Treating Agent Composition (10) of the Present Invention The composition of the present invention (10) (50 mL) prepared in Example 10 was poured into a 200 mL plastic beaker, and heated up to 40° C. and kept at the same temperature for 10 minutes in advance. The above-described substrate sample for evaluation was kept dipped into this heated solution for 5 minutes under gentle stirring. After that, the substrate sample was rinsed with pure water for 30 seconds, and the substrate surface was dried by compressed air. From visual observation of the substrate sample after drying, it was confirmed that all of the resist layer, the cured resist layer and the anti-reflection coating layer had been well removed. Consequently, it was found that by dipping the substrate sample for evaluation in the composition of the present invention which was heated up in advance for 5 minutes, not only an anti-reflection coating layer (BARC layer) but also even a resist layer and a cured resist layer could be removed at the same time.

Example 22

Evaluation of the Semiconductor Surface Treating Agent Composition (11) of the Present Invention In Example 22, the substrate sample was dipped for 3 minutes, washed by rinsing, and dried by the same method as in Example 21, except that the composition of the present invention (11) was used, and the substrate sample after drying was visually observed. As the results, it was confirmed that all of the resist layer, the cured resist layer and the anti-reflection coating layer had been well removed, and it was found that by dipping the substrate sample for evaluation in the composition of the present invention which was heated up in advance for 3 minutes, not only an anti-reflection coating layer (BARC layer) but also even a resist layer and a cured resist layer could be removed at the same time.

From the results of Examples 21 to 22, it was found that even when VA-057 and V-70, which were a compound (heat radical generating agent) suitably generating a carbon radical by heating, were used as a carbon radical generating agent, not only the anti-reflection coating layer (BARC layer) but also even the resist layer and the cured resist layer could be well removed. In addition, it was found that even when the solution (the semiconductor surface treating agent composition of the present invention) was heated up in advance but was not heated up during the dipping and the substrate sample was treated in the same method, superior removing could be realized.

Example 23

Evaluation of Preliminary Light Irradiation Using the Semiconductor Surface Treating Agent Composition (2) of the Present Invention The composition of the present invention (2) (50 mL) prepared in Example 2 was poured into a 200 mL plastic beaker. The composition was kept irradiated by light having a center wavelength of 320 nm at room temperature for 3 minutes using an ultraviolet irradiation apparatus (Ultraviolet Irradiation apparatus MUV-35U with MUV-PF001 filter, manufactured by MORITEX Corp.). After that, the above-described substrate sample for evaluation was dipped to the solution which was irradiated by light in advance, and kept dipped for 3 minutes under gentle stirring. The light irradiation was not carried out during the dipping. After that, the substrate sample was rinsed with pure water for 30 seconds, and the substrate surface was dried by compressed air. From visual observation of the substrate sample after drying, it was confirmed that all of the resist layer, the cured resist layer and the anti-reflection coating layer (BARC layer) could be well removed.

From the results of Example 23, it was found that when a compound (photo radical generating agent) suitably generating a carbon radical by light irradiation was used as a carbon radical generating agent, if light irradiation was applied in advance to generate carbon radical, superior removing could be realized even if light irradiation was not carried out during the dipping. It should be noted that, from the fact that even when light irradiation was applied in advance, superior removing could be realized; the carbon radical generated by the light irradiation does not seem to be deactivated immediately in the semiconductor surface treating agent composition of the present invention.

Comparative Examples 4 to 5

Evaluations of Comparative Compositions (1) to (2)

The comparative composition (1) (50 mL) prepared in Comparative Example 1 and the comparative composition (2) (50 mL) prepared in Comparative Example 2 were poured into separate 200 mL plastic beakers. Each of the above-described substrate samples for evaluation was kept dipped therein at room temperature for 30 minutes under gentle stirring, while the substrate sample was irradiated by light having a center wavelength of 320 nm using an ultraviolet irradiation apparatus (Ultraviolet Irradiation apparatus MUV-35U with MUV-PF001 filter, manufactured by MORITEX Corp.). However, even though dipping was continued for 30 minutes, the resist layer and the cured resist layer could not be removed, and also the anti-reflection coating layer (BARC layer) locating at the lower layer of these layers could be hardly removed.

From the results of Comparative Examples 4 and 5, it was considered that since a specified organic solvent among organic solvents was not used, the resist layer and the cured resist layer could not be removed, and hence the anti-reflection coating layer (BARC layer) coated on the lower layer of the resist layer could not be removed. Consequently, it was found that in the present invention, in particular, when a substrate, in which an anti-reflection coating layer was BARC layer, and a resist layer and a cured resist layer were coated thereon, was treated intending to remove the BARC layer, the resist layer and the cured resist layer at the same time, it was necessary to use the specified organic solvent mentioned above.

Example 24

Evaluation of Cupper Wiring when the Semiconductor Surface Treating Agent Composition (2) of the Present Invention is Used A Cu/Low-k substrate (Low-k film: Black diamond-1) was dipped in a solution (50 mL) of the composition of the present invention (2) prepared in Example 2. After that, the substrate was taken out from the dipping solution, and the substrate surface was dried with compressed air. Effect of the composition of the present invention on the copper layer surface was evaluated by observing this substrate sample after drying using an optical microscope (1,000 magnifications). As a result, it was confirmed that the copper layer surface of the substrate after dipping for 10 minutes still had a metallic luster, and an oxide film had not been formed. In addition, surface roughness was examined using an atomic force microscope (Nanopics 2100, manufactured by SII Nano-Technology Inc.), and it was also confirmed that there was no change in average plane roughness from the level of 1 nm or less before the dipping treatment. From these results, it was found that the semiconductor surface treating agent composition of the present invention did not affect on the copper layer surface.

Comparative Example 6

Evaluation of Copper Wiring Using the Comparative Composition (3)

A Cu/Low-k substrate (Low-k film: Black diamond-1) was dipped in a solution (50 mL) of the comparative composition (3) prepared in Comparative Example 3 for 5 minutes. After that, the substrate was taken out from the dipping solution, and the substrate surface was dried with compressed air. Effect of the comparative composition on the copper layer surface was evaluated by observing this substrate sample after drying using an optical microscope (1,000 magnifications). As a result, it was confirmed that the copper layer surface of the substrate after dipping for 5 minutes did not have a metallic luster, and an oxide film of copper oxide had been formed. In addition, surface roughness was examined using an atomic force microscope (Nanopics 2100, manufactured by SII NanoTechnology Inc.), and it was also confirmed that average plane roughness had been increased from 1 nm or less before the dipping treatment to 4 nm showing deterioration of flatness. From these results, it was found that the comparative composition (3) negatively affected on the copper layer surface causing formation of an oxide film.

From the results of Example 24 and Comparative Example 6, the following was found. Among radical generating agents, when, for example, a radical generating agent which generates oxygen radical (oxygen radical generating agent) such as, for example, hydrogen peroxide is used, the agent negatively affects such that an oxide film is formed on the copper layer surface, and so on, but the composition of the present invention does not give such effect on the copper layer surface. From these results, it was found that even when a semiconductor substrate was the one having a multilayer copper wiring structure, the composition of the present invention could realize superior removing of an anti-reflection coating layer, or not only an anti-reflection coating layer but even a resist layer and a cured resist layer without negatively affecting on the copper layer surface. It should be noted that, as for the effect of an oxygen radical generating agent, it is supported by not only the evaluation with hydrogen peroxide only but also evaluations with the compositions in which each component of the present invention other than the carbon radical generating agent contains hydrogen peroxide.

Example 25

Evaluation of Low-K Film when the Semiconductor Surface Treating Agent Composition (2) of the Present Invention A substrate coated with a Low-k film was dipped in a solution (50 mL) of the composition of the present invention (2) prepared in Example 2 for 30 minutes. After that, the substrate was taken out from the dipping solution, and the substrate surface was dried with compressed air. The Low-k film surface of this substrate sample after drying was analyzed using an x-ray photoelectron spectrometer (XPS) (AXIS-his, manufactured by Kratos), and it was confirmed that there was no change in spectra between before and after the dipping. From this result, it was found that even when the substrate was the one which was coated with a Low-k film as an insulation film, the composition of the present invention could realize superior removing of an anti-reflection coating film or not only an anti-reflection coating layer but also even a resist layer and a cured resist layer.

Example 26

Preparation of a Semiconductor Surface Treating Agent Composition (12) of the Present Invention Water (99.44 g) was charged into a 200 mL plastic beaker. Ammonium fluoride (0.06 g) and 2-benzyl-2-dimethylamino-1-(4-morpholinophenyl)-butanone-1 (Irgacure 369, produced by Ciba Specialty Chemicals) (0.5 g) were added to the solution, and the solution was stirred at room temperature under irradiation by Yellow Lamp (straight tube yellow fluorescent lamp FLR40SY-IC/M, manufactured by Mitsubishi Electric OSRAM Ltd.), to obtain a composition (12) of the present invention of pH 6.

Examples 27 to 28

Preparations of Semiconductor Surface Treating Agent Compositions (13) to (14) of the Present Invention In Examples 27 to 28, compositions of the present invention (13) to (14) were obtained in the same way as in Example 26, except that each component shown in Table 4 was used in a charge amount shown in Table 4. Compositions of compositions of the present invention (12) to (14) are shown in Table 4. Numerical values shown in Table 4 are % concentrations of each component based on the total weight of the composition as 100%.

TABLE 4

| | | Example | | |
|---|---|---|---|---|
| | | 26 | 27 | 28 |
| | | Composition of the present invention | | |
| | | (12) | (13) | (14) |
| Compound generating a fluoride ion in water | Ammonium fluoride | 0.06 | 0.06 | 0.06 |
| Carbon radical generating agent | Irgacure 369 | 0.5 | 0.5 | |
| | V-70 | | | 0.5 |
| Water | Water | 99.44 | 99.24 | 99.24 |
| Acid | Citric acid | | 0.2 | |
| | Disodium citrate | | | 0.2 |
| pH | | 6 | 2 | 4 |

Irgacure 369: 2-Benzyl-2-dimethylamino-1-(4-morpholinophenyl)-butanone-1
V-70: 2,2'-Azobis(4-methoxy-2,4-dimethylvaleronitrile)

Comparative Example 7

Preparation of a Comparative Composition (4)

Water (99.94 g) was charged into a 200 mL plastic beaker. Ammonium fluoride (0.06 g) was added into the solution, and the solution was stirred at room temperature to obtain a comparative composition (4) of pH 6.

Example 29

Evaluation of the Semiconductor Surface Treating Agent Composition (12) of the Present Invention The composition (12) of the present invention (50 mL) prepared in Example 26 was poured into a 200 mL plastic beaker, and a substrate, in which an anti-reflection coating layer was exposed by removing a resist layer and a cured resist layer of the above-described substrate sample for evaluation, was dipped therein with gentle stirring at room temperature, while the substrate sample was irradiated by light having a center wavelength of 320 nm using an ultraviolet irradiation apparatus (Ultraviolet Irradiation apparatus MUV-35U with MUV-PF001 filter, manufactured by MORITEX Corp.), and removing of the anti-reflection coating layer during dipping was visually observed. As a result, removing of the anti-reflection coating layer could be confirmed at 3 minutes after initiation of the dipping, and complete removing of the anti-reflection coating layer could be confirmed at 15 minutes after initiation of the dipping.

Example 30

Evaluation of the Semiconductor Surface Treating Agent Composition (13) of the Present Invention In Example 30, dipping was carried out in the same method as in Example 29 except that the composition (13) of the present invention was used, and removing of the anti-reflection coating layer was visually observed. As a result, when the composition (13) of the present invention was used, complete removing of anti-reflection coating layer could be confirmed at 3 minutes after initiation of the dipping.

Example 31

Evaluation of the Semiconductor Surface Treating Agent Composition (14) of the Present Invention The composition (14) of the present invention (50 mL) prepared in Example 28 was poured into a 200 mL plastic beaker, and a substrate, in which an anti-reflection coating layer was exposed by removing a resist layer and a cured resist layer of the above-described substrate sample for evaluation, was dipped in a solution of the above-described composition (14) heated up at 40° C. with gentle stirring, and removing of the anti-reflection coating layer during dipping was visually observed. As a result, complete removing of the anti-reflection coating layer could be confirmed at 3 minutes after initiation of the dipping.

Comparative Example 8

Evaluation of the Comparative Composition (4)

The comparative composition (4) (50 mL) prepared in Comparative Example 7 was poured into a 200 mL plastic beaker, and a substrate, in which an anti-reflection coating layer was exposed by removing a resist layer and a cured resist layer of the above-described substrate sample for evaluation, was dipped therein with gentle stirring at room temperature, while the substrate sample was irradiated by a light having a center wavelength of 320 nm using an ultraviolet irradiation apparatus (Ultraviolet Irradiation apparatus MUV-35U with MUV-PF001 filter, produced by MORITEX Corp.), and removing of the anti-reflection coating layer during dipping was visually observed. However, although dipping was continued for 30 minutes, the anti-reflection coating layer could not be removed at all.

Comparative Examples 9 to 10

Evaluation Using the Semiconductor Surface Treating Agent Compositions (12) to (13) of the Present Invention without Light Irradiation The composition (12) of the present invention (50 mL) prepared in Example 26 and the composition (13) of the present invention (50 mL) prepared in Example 27 were poured into separate 200 mL plastic beakers, and a substrate, in which an anti-reflection coating layer was exposed by removing a resist layer and a cured resist layer of the above-described substrate sample for evaluation, was dipped therein with gentle stirring at room temperature without UV irradiation, and removing of the anti-reflection coating layer during dipping was visually observed. However, although dipping was continued for 30 minutes, the anti-reflection coating layer could not be removed at all.

Comparative Example 11

Evaluation Using the Semiconductor Surface Treating Agent Composition (14) of the Present Invention without Heating The composition (14) of the present invention (50 mL) prepared in Example 28 was poured into a 200 mL plastic beaker, and a substrate, in which an anti-reflection coating layer was exposed by removing a resist layer and a cured resist layer of the above-described substrate sample for evaluation, was dipped therein with gentle stirring at room temperature without heating, and removing of the anti-reflection coating layer during dipping was visually observed. However, although dipping was continued for 30 minutes, the anti-reflection coating layer could not be removed at all.

From the results of Examples 29 to 31 and Comparative Example 8, it was found that an anti-reflection coating layer could be removed only by using a compound generating a fluoride ion in water and a carbon radical generating agent in combination, and also that whichever of a compound which suitably generates carbon radical by light irradiation (photo radical generating agent) or a compound which suitably generates carbon radical by heating (heat radical generating agent), an anti-reflection coating layer could be well removed. Further, it was found that removing of the anti-reflection coating layer in a shorter time could be realized by adding an acid to facilitate formation of hydrofluoric acid in water. Still further, from the results of Comparative Examples 9 to 11, it was also found that carbon radical generated from a carbon radical generating agent was necessary for removing of an anti-reflection coating layer, because even though the composition of the present invention containing a carbon radical generating agent, an anti-reflection coating layer could not be removed if heating or light irradiation was not applied.

Examples 32 to 36

Preparations of Semiconductor Surface Treating Agent Compositions (15) to (19) of the Present Invention In Examples 32 to 36, compositions (15) to (19) of the present invention were obtained in the same way as in Example 1, except that each component shown in Table 5 was used in a charge amount shown in Table 5. Compositions of compositions (15) to (19) of the present invention are shown in Table 5. Numerical values shown in Table 5 are % concentrations of each component based on the total weight of the composition as 100%.

TABLE 5

| | | Example | | | | |
| --- | --- | --- | --- | --- | --- | --- |
| | | 32 | 33 | 34 | 35 | 36 |
| | | Composition of the present invention | | | | |
| | | (15) | (16) | (17) | (18) | (19) |
| Compound generating a fluoride ion in water | Ammonium fluoride | 0.06 | 0.06 | 0.06 | 0.06 | 0.06 |

TABLE 5-continued

|  |  | Example | | | | |
|---|---|---|---|---|---|---|
|  |  | 32 | 33 | 34 | 35 | 36 |
|  |  | Composition of the present invention | | | | |
|  |  | (15) | (16) | (17) | (18) | (19) |
| Carbon radical generating agent | VA-057 | 0.5 | | | | |
|  | V-601 | | 0.5 | | | |
|  | VA-086 | | | 0.5 | | |
|  | Irgacure 184 | | | | 0.5 | |
|  | Irgacure 651 | | | | | 1 |
| Water | Water | 1.94 | 1.94 | 1.94 | 1.94 | 1.94 |
| Organic solvent | γ-butyrolactone | 96 | 96 | 96 | 96 | 95.5 |
| Acid | Citric acid | 0.2 | 0.2 | 0.2 | 0.2 | 0.2 |
| Reducing agent | Ascorbyl pulmitate | 0.01 | 0.01 | 0.01 | 0.01 | 0.01 |
| Surfactant | Neocol P | 1.29 | 1.29 | 1.29 | 1.29 | 1.29 |
|  | pH | 2 | 2 | 2 | 2 | 2 |

VA-057: 2,2'-Azobis[N-(2-carboxyethyl)-2-methylpropionamidine] tetrahydrate
V-601: Dimethyl-2,2'-azobis(2-methylpropionate)
VA-086: 2,2'-Azobis[2-methyl-N-(2-hydroxyethyl)propionamide]
Irugacure 184: 1-Hydroxycyclohexylphenylketone
Irgacure 651: 2,2-Dimethoxy-1,2-diphenylethan-1-on
Neocol P: Sodium alkylsulfosuccinate Example 37

Evaluation of the Semiconductor Surface Treating Agent Composition (1) of the Present Invention The composition (1) of the present invention (50 mL) prepared in Example 1 was poured into a 200 mL plastic beaker. The above-described substrate sample for evaluation was kept dipped therein at room temperature for 5 minutes under gentle stirring, while the substrate sample was irradiated by light having a center wavelength of 320 nm using an ultraviolet irradiation apparatus (Ultraviolet Irradiation apparatus MUV-35U with MUV-PF001 filter, produced by MORITEX Corp.). After that, the substrate sample was rinsed with pure water for 30 seconds, and the substrate surface was dried by compressed air. From visual observation of the substrate sample after drying, it was confirmed that the resist layer and the cured resist layer could be well removed without remaining residue, and that 90% or more of the anti-reflection coating layer could be removed. Example 12 is an evaluation result when the substrate sample for evaluation was kept dipped in the composition (1) of the present invention for 30 minutes, and Example 37 is an evaluation result when the substrate sample for evaluation was kept dipped for 5 minutes using the same composition (1) under the same conditions as in Example 12. From these results, it was conformed that the compound (I) of the present invention could remove not only an anti-reflection coating layer (BARC layer) but also even a resist layer and a cured resist layer at the same time, even if the substrate sample was not dipped for a long time (30 minutes), that is, even if the substrate sample was dipped for a short time (5 minutes).

Examples 38 to 42

Evaluations of the Semiconductor Surface Treating Agent Compositions (15) to (19) of the Present Invention In Examples 38 to 42, the substrate sample was dipped in each of compositions (15) to (19) of the present invention for 5 minutes in the same method as in Example 12, and removing performances for a resist layer, a cured resist layer and an anti-reflection coating layer were visually observed. The results are shown in Table 6 together with the results of Example 37.

TABLE 6

| | Composition of | Removing performance | | |
|---|---|---|---|---|
| Example | the present invention | Resist layer | Cured resist layer | Anti-reflection coating layer |
| 37 | (1) | ⊚ | ⊚ | ⊚ |
| 38 | (15) | ⊚ | ⊚ | ⊚ |
| 39 | (16) | ⊚ | ⊚ | ⊚ |
| 40 | (17) | ⊚ | ⊚ | ⊚ |
| 41 | (18) | ⊚ | ⊚ | ⊚ |
| 42 | (19) | ⊚ | ⊚ | ○ |

⊚: 90% or more removed
○: around 50% removed

From the results of Examples 37 to 42, it was found that in the semiconductor surface treating agent composition of the present invention, various compounds which generated carbon radical could be used as a carbon radical generating agent. In addition, carbon radical generating agents such as azonitrile type carbon radical generating agents, azoamide type carbon radical generating agents, chain-like azoamidine type carbon radical generating agents, cyclic azoamidine type carbon radical generating agents, azoester type carbon radical generating agents could generate carbon radical by heating. It was also found that not only an anti-reflection coating layer (BARC layer) but also a resist layer and a cured resist layer could be well removed by using such carbon radical generating agent and even by generating carbon radical by light irradiation.

From the results mentioned above, when a semiconductor substrate surface having an anti-reflection coating layer and the like is treated with the semiconductor surface treating agent composition of the present invention, it can be expected not only that these layers can be efficiently removed in a short time, but also that even when the semiconductor substrate is provided with a copper wiring such as, for example, multilayer copper wiring structure as a metal wiring of semiconductor, or a lower layer of the treatment layers is an insulation film such as a Low-k film and the like which are easily affected by alkali, the above-described layers can be efficiently removed without adversely affecting on these wiring and film.

INDUSTRIAL APPLICABILITY

The semiconductor surface treating agent composition of the present invention has a superior removing performance such that easy removing of an anti-reflection coating layer in a production process of semiconductor devices in a short time can be realized, and further by comprising a component such as an organic solvent, the composition can realize that not only an anti-reflection coating layer but also even a resist layer and a cured resist layer can be removed together with an anti-reflection coating layer at the same time. In addition, since the semiconductor surface treating agent composition of the present invention does not adversely affect on a copper wiring on the semiconductor substrate surface and an insulation film such as a Low-k film locating at the lower layer of the treatment layers and the like, the semiconductor surface treating agent composition of the present invention can be suitably used for a semiconductor substrate having these compositions.

In addition, since the treatment method for semiconductor surface of the present invention is the one by which an anti-reflection coating layer or not only an anti-reflection coating layer but also even a resist layer and a cured resist layer can be easily removed in a short time at the same time, removing of these treatment layers can be realized even if cumbersome procedures such as conventional ashing process are not carried out.

What is claimed is:

1. A semiconductor surface treating agent composition, comprising:
    a compound generating a fluoride ion in water,
    a carbon radical generating agent, and
    water,
    wherein the carbon radical generating agent is selected from the group consisting of azonitrile type carbon radical generating agents, azoamide type carbon radical generating agents, chain-like azoamidine type carbon radical generating agents, cyclic azoamidine type carbon radical generating agents, azoester type carbon radical generating agents, azonitrile carboxylic acid type carbon radical generating agents, azoalkyl type carbon radical generating agents, macroazo type carbon radical generating agents, benzoin alkyl ether type carbon radical generating agents, benzylketal type carbon radical generating agents, benzophenone type carbon radical generating agents, aminobenzoate ester type carbon radical generating agents, 1, 2-hydroxyalkylphenone type carbon radical generating agents, 1, 2-aminoalkylphenone type carbon radical generating agents, acylphosphin oxide type carbon radical generating agents, anthraquinone type carbon radical generating agents, thioxanthone type carbon radical generating agents, acridone type carbon radical generating agents, biimidazole type carbon radical generating agents, oxime ester type carbon radical generating agents and titanocene type carbon radical generating agents.

2. The composition according to claim 1, wherein the composition further comprises an acid.

3. The composition according to claim 1, wherein the composition further comprises an organic solvent.

4. The composition according to claim 3, wherein the composition further comprises a reducing agent.

5. The composition according to claim 4, wherein the composition further comprises a surfactant.

6. The composition according to claim 1, wherein the semiconductor surface treating agent is a separating agent for anti-reflection coating layer.

7. The composition according to claim 3, wherein the semiconductor surface treating agent is a separating agent for BARC layer.

8. The composition according to claim 1, wherein the compound generating a fluoride ion in water is a salt of hydrofluoric acid and an inorganic non-metal base.

9. The composition according to claim 8, wherein the salt of hydrofluoric acid and the inorganic non-metal base is ammonium fluoride.

10. The composition according to claim 1, wherein the carbon radical generating agent is a compound which generates carbon radical by irradiation of light having a wavelength of 200 to 750 nm.

11. The composition according to claim 2, wherein the acid is at least one kind of acid selected from aliphatic or aromatic dicarboxylic acids and aliphatic or aromatic hydroxycarboxylic acids.

12. The composition according to claim 11, wherein the aliphatic or aromatic dicarboxylic acids and aliphatic or aromatic hydroxycarboxylic acids is at least one kind of acid selected from oxalic acid, malonic acid, succinic acid, glutaric acid, adipic acid, pimelic acid, maleic acid, fumaric acid, malic acid, tartaric acid, citric acid and phthalic acid.

13. The composition according to claim 11, wherein the aliphatic or aromatic dicarboxylic acid and aliphatic or aromatic hydroxycarboxylic acid is at least one kind of acid selected from oxalic acid, malic acid, tartaric acid and citric acid.

14. The composition according to claim 3, wherein the organic solvent is at least one kind of solvent selected from alcohols, esters, amides or sulfoxides, and wherein each selected organic solvent itself has dipole moment of 1.5 to 7.5 debye as well as each selected organic solvent itself has specific gravity in a range from 0.7 to 1.2.

15. The composition according to claim 3, wherein the organic solvent is at least one kind of solvent selected from isopropyl alcohol, γ-butyrolactone and N-methylpyrrolidone.

16. The composition according to claim 4, wherein the reducing agent is at least one kind of reducing agent selected from ascorbic acid and ascorbic acid esters.

17. The composition according to claim 2, wherein the semiconductor surface treating agent is a removing agent for anti-reflection coating layer, and a lower layer of the anti-reflection coating layer is a Low-k film, and wherein the composition has pH of 7 or lower.

18. The composition according to claim 2, wherein the semiconductor surface treating agent is a removing agent for anti-reflection coating layer, and a lower layer of the anti-reflection coating layer is a Low-k film, and wherein the composition has pH in a range from 1 to 4.

19. The composition according to claim 1, wherein the composition is applied to a semiconductor substrate having a multilayer copper wiring structure.

20. The composition according to claim 3, wherein the composition is applied to a semiconductor substrate having a multilayer copper wiring structure.

21. A method for treating semiconductor surface wherein the composition according to claim 1 is applied to the semiconductor surface to be treated.

22. The composition according to claim 2, wherein content of the compound generating a fluoride ion in water is 0.01 to 5% by weight, content of the carbon radical generating agent is 0.05 to 10% by weight, content of the water is 85 to 99.89% by weight, and content of the acid is 0.05 to 5% by weight.

23. The composition according to claim 5, wherein the composition further comprises an acid.

24. The composition according to claim 5, wherein content of the compound generating a fluoride ion in water is 0.01 to 5% by weight, content of the carbon radical generating agent is 0.05 to 10% by weight, content of the water is 0.02 to 10% by weight, content of the organic solvent is 80 to 99% by weight, content of the reducing agent is 0.001 to 5% by weight, and content of the surfactant is 0.05 to 5% by weight.

25. The composition according to claim 1, wherein the carbon radical generating agent is selected from the group consisting of azonitrile type carbon radical generating agents, azoamide type carbon radical generating agents, chain-like azoamidine type carbon radical generating agents, cyclic azoamidine type carbon radical generating agents, azoester type carbon radical generating agents, benzoin alkyl ether type carbon radical generating agents, benzylketal type carbon radical generating agents, benzophenone type carbon radical generating agents, aminobenzoate ester type carbon radical generating agents, 1, 2-hydroxyalkylphenone type carbon radical generating agents, 1, 2-aminoalkylphenone type carbon radical generating agents, acylphosphin oxide type carbon radical generating agents, anthraquinone type carbon radical generating agents, thioxanthone type carbon radical generating agents, acridone type carbon radical generating agents, biimidazole type carbon radical generating agents, oxime ester type carbon radical generating agents and titanocene type carbon radical generating agents.

26. The composition according to claim 1, wherein the carbon radical generating agent is selected from the group consisting of azonitrile type carbon radical generating agents, azoamide type carbon radical generating agents, chain-like azoamidine type carbon radical generating agents, azoester type carbon radical generating agents, benzylketal type carbon radical generating agents, 1, 2-hydroxyalkylphenone type carbon radical generating agents and 1, 2-aminoalkylphenone type carbon radical generating agents.

27. The composition according to claim 1, wherein the biimidazole type carbon radical generating agents are selected from 2,2'-bis(o-chlorophenyl)-4,5,4',5'-tetraphenyl-1,2'-biimidazole and 2,2'-bis(o-chlorophenyl)-4,5 ,4',5'-tetrakis(3 ,4,5-trimethoxyphenyl)-1,2'-biimidazole.

28. The composition according to claim 23, wherein content of the compound generating a fluoride ion in water is 0.01 to 5% by weight, content of the carbon radical generating agent is 0.05 to 10% by weight, content of the water is 0.02 to 10% by weight, content of the acid is 0.1 to 5% by weight, content of the organic solvent is 80 to 99% by weight, content of the reducing agent is 0.001 to 5% by weight, and content of the surfactant is 0.05 to 5% by weight.

\* \* \* \* \*